(12) United States Patent
Lai

(10) Patent No.: US 7,719,805 B2
(45) Date of Patent: May 18, 2010

(54) ESD PROTECTION CIRCUIT

(75) Inventor: Chun-Hsiang Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 759 days.

(21) Appl. No.: 11/565,675

(22) Filed: Dec. 1, 2006

(65) Prior Publication Data

US 2008/0128816 A1 Jun. 5, 2008

(51) Int. Cl.
*H02H 9/00* (2006.01)
(52) U.S. Cl. ........................................ 361/56
(58) Field of Classification Search .................. 361/56

See application file for complete search history.

(56) References Cited

U.S. PATENT DOCUMENTS 6,465,768 B1 * 10/2002 Ker et al. .................. 250/214.1

* cited by examiner

*Primary Examiner*—Stephen W Jackson
(74) *Attorney, Agent, or Firm*—Thomas, Kayden, Horstemeyer & Risley

(57) ABSTRACT

An ESD protection circuit connected between an input pad and an internal circuit is disclosed. The ESD protection circuit includes a main ESD protection device, a first resistor and a secondary device. The main ESD protection device is connected to the input pad for clamping a voltage of the input pad. The first resistor has a first end connected to the input pad and a second end connected to the internal circuit. The secondary device is connected to the second end of the first resistor and the main ESD protection device for clamping a voltage of the internal circuit. During an ESD event, the secondary device is turned on first to receive an ESD current and accordingly provides a trigger current to turn on the main ESD protection device.

18 Claims, 4 Drawing Sheets

ESD PROTECTION CIRCUIT

BACKGROUND OF THE INVENTION

1. Field of the Invention

The invention relates in general to an ESD protection circuit, and more particularly to a substrate-triggered ESD protection circuit.

2. Description of the Related Art

FIG. 1 is a block diagram of a conventional substrate-triggered ESD protection circuit. As shown in FIG. 1, for an input pad 110, it will receive an external signal S to an internal circuit 120, such as an input buffer. An ESD protection circuit 100 is connected between the input pad 110 and internal circuit 120 for protecting the internal circuit 120 from ESD damage. The ESD protection circuit 100 includes a primary device 102, a resistor R, and a secondary device 104. The resistor R is connected between the input pad 110 and internal circuit 120. The primary device 102 is connected to the input pad 110 and one end of the resistor R for clamping the voltage of the input pad 110, and the secondary device 104 is connected to the internal circuit 120 and the other end of the resistor R for clamping the voltage of the internal circuit 120.

The primary device 102 further includes a substrate pump 102a and a main ESD protection device 102b, such as a field transistor with a parasitic bipolar junction transistor (BJT). The main ESD protection device 102b is connected to the input pad 110 and resistor R. The substrate pump 102a is connected to the input pad 110 and the main ESD protection device 102b for pumping the substrate voltage of the main ESD protection device 102b.

When an ESD current enters the input pad 110, the voltage of the input pad 110 will rise rapidly and the secondary device 104 is turned on first to clamp the voltage of the internal circuit 120. The voltage of the input pad 110 keeps rising until the substrate pump 102a is turned on to drain the ESD current into the bulk of the main ESD protection device 102b to raise its potential. Higher bulk potential can speed up the turn-on of the main ESD protection device 102b and make it drain most of the ESD current more efficiently.

However, the substrate pump 102a is conventionally formed by a RC circuit or a RC-coupled inverter. In order to couple enough voltages from the input pad 110 to the bulk of the main ESD protection device 102b, a large area of the RC circuit or RC-coupled inverter needs to be used, which increases the production cost. In some applications, the substrate pump 102a is implemented by a ground-gate N-type metal oxide semiconductor (NMOS) transistor. Because of the gate-aided effect, the ground-gate NMOS transistor turns on before the main ESD protection device 102b and may fail first if the protection device 102b cannot turn on immediately, therefore the substrate pump 102a will be damaged.

SUMMARY OF THE INVENTION

It is therefore an object of the invention to provide an ESD protection circuit. During an ESD event, the secondary device is turned on first to receive an ESD current and accordingly provides a trigger current to turn on the main ESD protection device without using the prior-art substrate pump. Therefore, a better ESD protection effect can be achieved in the meanwhile the area and cost of the ESD protection circuit can be reduced.

The invention achieves the above-identified object by providing an ESD protection circuit connected between an input pad and an internal circuit. The ESD protection circuit includes a main ESD protection device, a first resistor and a secondary device. The main ESD protection device is connected to the input pad for clamping a voltage of the input pad. The first resistor has a first end connected to the input pad and a second end connected to the internal circuit. The secondary device is connected to the second end of the first resistor and the main ESD protection device for clamping a voltage of the internal circuit. During an ESD event, the secondary device is turned on first to receive an ESD current and accordingly provides a trigger current to turn on the main ESD protection device.

The invention achieves the above-identified object by providing an ESD protection circuit connected between an input pad and an internal circuit. The ESD protection circuit includes a snapback device, such as a field oxide device, an NMOS, a first resistor, and a secondary device. The snapback device has a substrate and connected to the input pad for clamping a voltage of the input pad. The snapback device forms one or more parasitic BJT. The first resistor has a first end connected to the input pad and a second end connected to the internal circuit. The secondary device is connected to the second end of the first resistor and the substrate of the snapback device for clamping a voltage of the internal circuit. During an ESD event, the secondary device is turned on first to receive an ESD current and accordingly provides a trigger current to turn on the BJT of the snapback device.

Other objects, features, and advantages of the invention will become apparent frothier following detailed description of the preferred but non-limited embodiments. The following description is made with reference to the accompanying drawings.

DETAILED DESCRIPTION OF THE INVENTION

Figure 1:
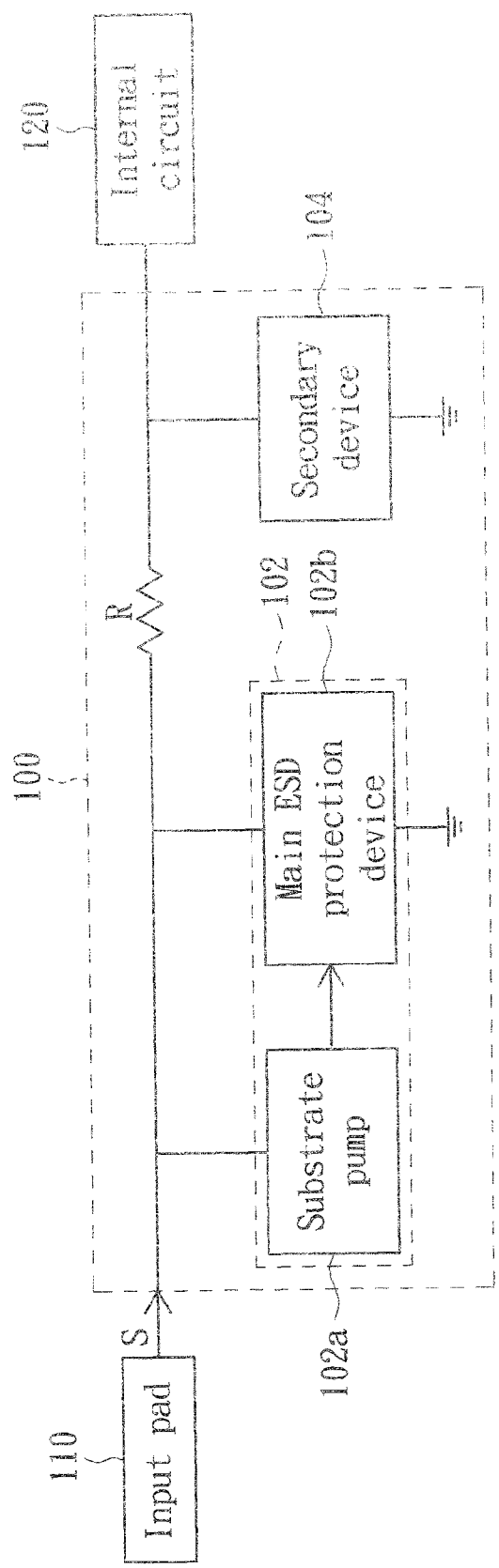
FIG. 1 is a block diagram of a conventional substrate-triggered ESD protection circuit.
Figure 2:
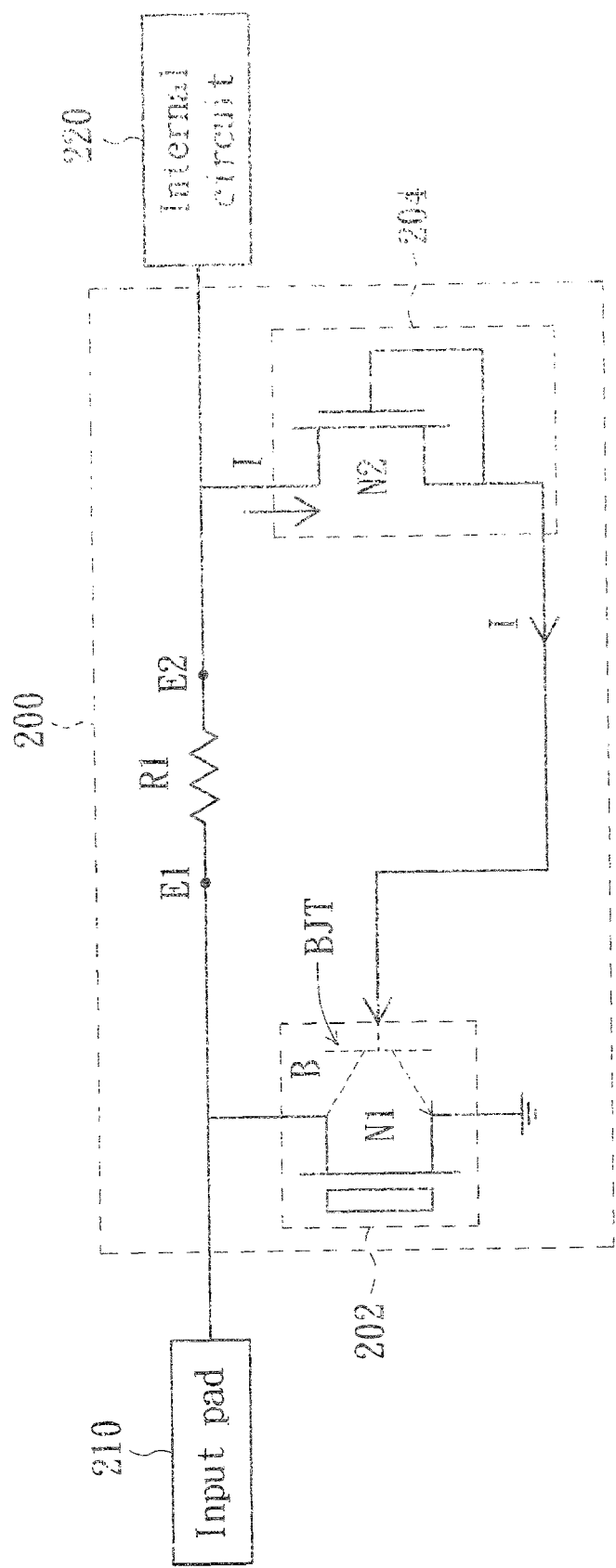
FIG. 2 is a circuit diagram of an ESD protection circuit according to a preferred embodiment of the invention.

Referring to FIG. 2, a circuit diagram of an ESD protection circuit according to a preferred embodiment of the invention is shown. An ESD protection circuit 200, such as having a substrate-triggered scheme, is connected between an input pad (or I/O pad) 210 and an internal circuit 220 for preventing the internal circuit 220 from ESD damage. For example, the internal circuit 220 is an input buffer, a pass gate or an input driver. The ESD protection circuit 200 includes a main ESD protection device 202, a first resistor R1 and a secondary device 204. The main ESD protection device 202 is connected to the input pad 210 for clamping a voltage of the input pad 210. The first resistor R1 has a first end E1 connected to the input pad 210 and a secondary end E2 connected to the internal circuit 220. Furthermore, the secondary device 204 is connected to the second end E2 of the first resistor R1 and the main ESD protection device 202 for clamping a voltage of the internal circuit 220.

In the embodiment, the main ESD protection device 202 is a snapback device, such as a field oxide device 202, having a parasitic BJT, and the secondary device 204 is a ground-gate NMOS transistor N2. A source of the ground-gate NMOS transistor N2 is connected to a substrate B of the NMOS transistor N1, i.e. a base of the parasitic BJT.

The main feature of the ESD protection circuit 200 in the invention lies in the fact that the first resistor R1 and the secondary device 204 are directly used as a substrate pump for the main ESD protection device 202 without need of an extra substrate pump, and the resistor R1 and the secondary device 204 are necessary components in an I/O pad circuit, which do not occupy extra area. Therefore, the area and cost of the ESD protection circuit can be reduced.

Because of the gate-aided effect, the breakdown voltage of the ground-gate NMOS transistor N2 is much lower than that of the field oxide device 202. Therefore, during an ESD event, the secondary device 204 can turn on first to receive an ESD current I and output the ESD current I as a trigger current to turn on the BJT of the NMOS N1 more uniformly and then enhance the turn-on performance of the main ESD protection device 202.

The first resistor R1 can limit the ESD current I flowing into the secondary device 204 to avoid its damage. Besides, it also separates the input pad 210 and the internal circuit 220 to prevent failure of the internal circuit 220. The resistance of the first resistor R1 is larger than 200Ω preferably.

Figure 3:
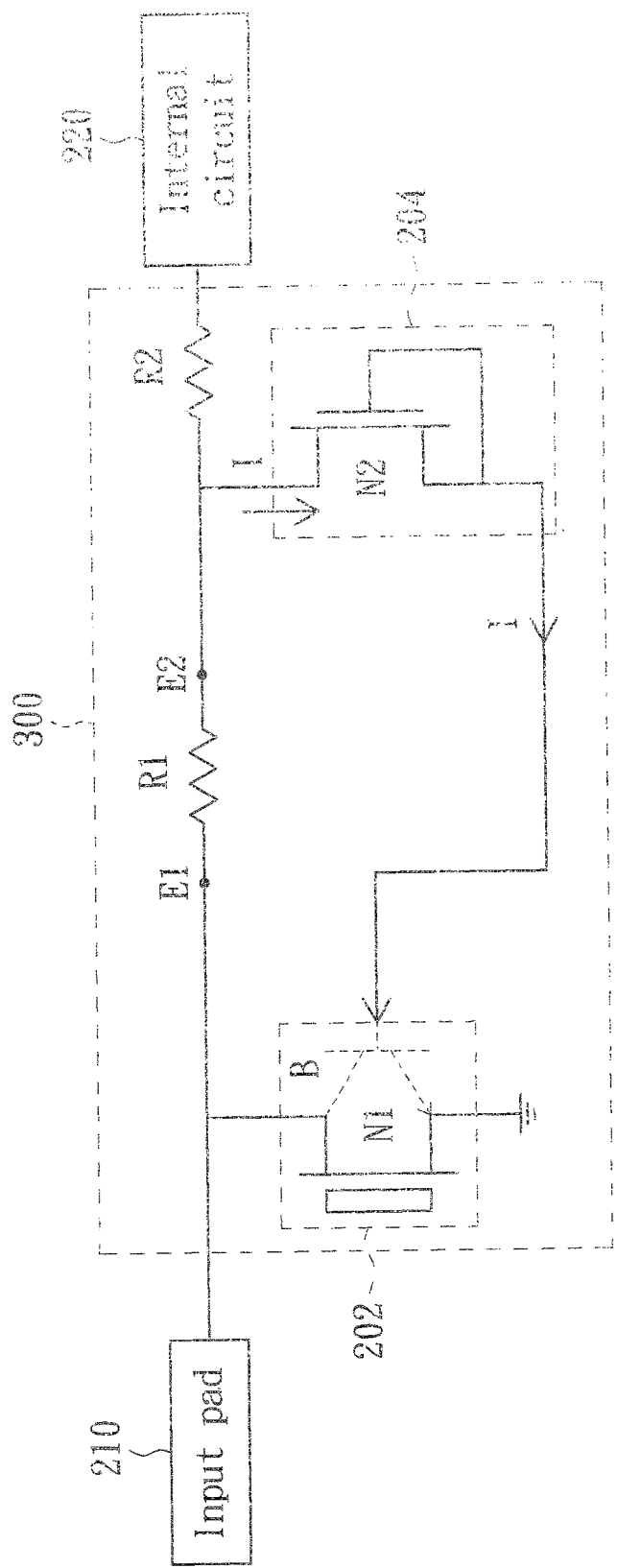
FIG. 3 is a circuit diagram of another ESD protection circuit according to the preferred embodiment of the invention.

Referring to FIG. 3, a circuit diagram of another ESD protection circuit according to the preferred embodiment of the invention is shown. Different from the ESD protection circuit 200 of FIG. 2, the ESD protection circuit 300 further includes a second resistor R2 connected between the second end E2 of the first resistor R1 and the internal circuit 220. The first resistor R1, having a resistance of 30Ω~50Ω preferably, is used to limit the ESD current I flowing into the secondary device 204 and avoid damage of the secondary device 204. The second resistor R2 and the first resistor R1, whose resistance sum is larger than 200Ω preferably, can separate the input pad 210 and the internal circuit 220 to prevent failure of the internal circuit 220.

Therefore, during the ESD event, not only the secondary device 204 can be better protected from ESD damage, but also the main ESD protection device 202 can have a better turn-on performance due to the trigger of the secondary device 204 without using an extra substrate pump, which in turn reduces the area and cost of the ESD protection circuit 300.

Although the turned-on secondary device 204 is exemplified to output the ESD current I as the trigger current to turn on the BJT of the snapback device during the ESD event, the turned-on secondary device 204 of the ESD protection circuit 200 (300) can also output a trigger current to turn on the main ESD protection device 202 according to the ESD current I. As long as the secondary device 204 can pump the bulk potential of the main ESD protection device 202 to achieve an effect of better turn-on performance, all the alternatives will not depart from the scope of the invention.

Figure 4:
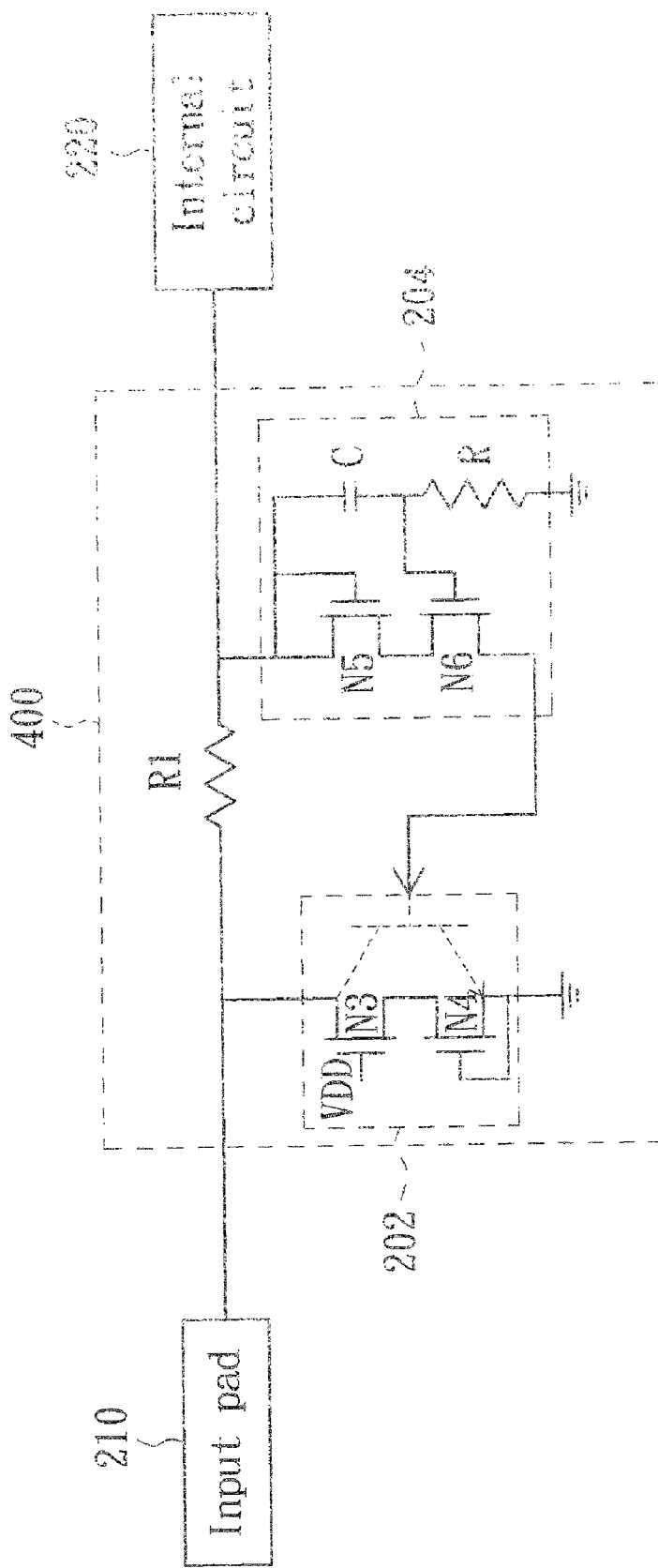
FIG. 4 is a circuit diagram of another ESD protection circuit according to the preferred embodiment of the invention.

Besides, the main ESD protection device 202 and the secondary device 204 are not limited to the field oxide device 202 and the ground-gate NMOS transistor N2 respectively. For example, as shown in the ESD protection circuit 400 of FIG. 4, the main ESD protection device 202 can include cascade NMOS transistors N3 and N5, the secondary device 204 can include RC-coupled cascade NMOS transistors N5 and N6, and a source of the NMOS transistor N6 is connected to the substrate of the NMOS transistors N3 and N5 (i.e. a base of a parasitic BJT thereof). Due to the effect of the diode-connected gate of the NMOS transistor N5 and the RC-coupled circuit, the turn-on voltage of the secondary device 204 can be much lower than that of the main ESD protection device 202. Therefore, the secondary device 204 can turn on first and then pump the bulk potential of the main ESD protection device 202 to enhance its turn-on performance.

The ESD protection circuit disclosed by the preferred embodiment of the invention has the following advantages:

1. In the ESD protection circuit, the secondary device is used to pump the substrate potential of the main ESD protection device such that the main ESD protection device can turn on more uniformly and efficiently.

2. In the ESD protection circuit, the resistor is used to limit the ESD current which flows into the secondary device to avoid its damage.

3. All the devices including the main ESD protection device, the secondary device and the resistor are the original devices for an I/O pad. Therefore, the area and cost of the ESD protection circuit can be reduced, as compared to the prior-art ESD protection circuit triggering the main ESD protection device by using an extra substrate pump.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An ESD protection circuit, connected between an input pad and an internal circuit, comprising:
    a main ESD protection device, connected to the input pad for clamping a voltage of the input pad, wherein the main ESD protection device comprises a snapback device with at least one parasitic bipolar junction transistor (BJT);
    a first resistor, having a first end connected to the input pad and a second end connected to the internal circuit; and
    a secondary device, connected to the second end of the first resistor and a substrate of the snapback device of the main ESD protection device for clamping a voltage of the internal circuit;
    wherein during an ESD event, the secondary device is turned on first to receive an ESD current and accordingly provides a trigger current to turn on the main ESD protection device.

2. The protection circuit according to claim 1, wherein the snapback device is a field oxide device, the secondary device is a ground-gate NMOS transistor, and a source of the ground-gate NMOS transistor is connected to the substrate of the snapback device.

3. The protection circuit according to claim 1, wherein the snapback device comprises cascade NMOS transistors, the secondary device comprises RC-coupled cascade NMOS transistors, and a source of the RC-coupled cascade NMOS transistors is connected to the substrate of the snapback device.

4. The protection circuit according to claim 1, wherein during the ESD event, the secondary device provides the trigger current to the substrate of the snapback device to turn on the BJT according to the ESD current.

5. The protection circuit according to claim 1, wherein during the ESD event, the turned-on secondary device outputs the ESD current as the trigger current to turn on the main ESD protection device.

6. The protection circuit according to claim 1, further comprising a second resistor connected between the second end of the first resistor and the internal circuit.

7. The protection circuit according to claim 6, wherein resistance of the first resistor is 30Ω~50Ω, and resistance sum of the first resistor and the second resistor is larger than 200Ω.

8. The protection circuit according to claim 1, wherein resistance of the first resistor is larger than 200Ω.

9. The protection circuit according to claim 1, wherein the input pad is an I/O pad.

10. The protection circuit according to claim 1, wherein the internal circuit is an input buffer, a pass gate or an output driver.

11. An ESD protection circuit, connected between an input pad and an internal circuit, comprising:
- a snapback device, having a substrate and connected to the input pad for clamping a voltage of the input pad, wherein the snapback device forms at least one parasitic BJT;
- a first resistor, having a first end connected to the input pad and a second end connected to the internal circuit; and
- a secondary device, connected to the second end of the first resistor and the substrate of the snapback device for clamping a voltage of the internal circuit;
- wherein during an ESD event, the secondary device is turned on first to receive an ESD current and accordingly outputs the ESD current as a trigger current to turn on the BJT of the snapback device.

12. The protection circuit according to claim 11, wherein the snapback device is a field transistor, the secondary device is a ground-gate NMOS transistor, and a source of the ground-gate NMOS transistor is connected to the substrate of the snapback device.

13. The protection circuit according to claim 11, wherein the snapback device comprises cascade NMOS transistors, the secondary device comprises RC-coupled cascade NMOS transistors, and a source of the RC-coupled cascade NMOS transistors is connected to the substrate of the snapback device.

14. The protection circuit according to claim 11, further comprising a second resistor connected between the second end of the first resistor and the internal circuit.

15. The protection circuit according to claim 14, wherein resistance of the first resistor is 30Ω~50Ω, and the sum of resistances of the first resistor and the second resistor is larger than 200Ω.

16. The protection circuit according to claim 11, wherein resistance of the first resistor is larger than 200Ω.

17. The protection circuit according to claim 11, wherein the input pad is an I/O pad.

18. The protection circuit according to claim 11, wherein the internal circuit is an input buffer, a pass gate or an output driver.

* * * * *